United States Patent
Palkovich et al.

Patent Number: 5,900,794
Date of Patent: May 4, 1999

[54] SINGLE FORMER ACTIVE SHIELD MAGNETS

[75] Inventors: Alex Palkovich, Oxford; John Maurice Bird, Chalbury; Alan George Andrew Marcel Armstrong, Oxford, all of United Kingdom

[73] Assignee: Elscint, Ltd., Haifa, Israel

[21] Appl. No.: 08/743,244

[22] Filed: Nov. 5, 1996

[30] Foreign Application Priority Data

Nov. 9, 1995 [GB] United Kingdom ................. 9522968

[51] Int. Cl.⁶ .................................................. H01F 5/00
[52] U.S. Cl. ........................... 335/299; 335/216; 335/301; 335/306
[58] Field of Search ................................. 335/299, 216, 335/306, 301; 324/318, 319, 320

[56] References Cited

U.S. PATENT DOCUMENTS

| | | | |
|---|---|---|---|
| 4,385,277 | 5/1983 | Hanley | 324/309 |
| 4,799,017 | 1/1989 | Siebold et al. | 324/319 |
| 4,890,082 | 12/1989 | Fujita | 335/301 |
| 4,968,961 | 11/1990 | Miyajima et al. | 335/216 |
| 5,012,217 | 4/1991 | Palkovich et al. | 335/301 |
| 5,045,826 | 9/1991 | Laskaris | 335/301 |
| 5,083,085 | 1/1992 | Morad | 324/318 |
| 5,136,273 | 8/1992 | Ohta | 335/301 |
| 5,210,512 | 5/1993 | Davies | 335/216 |
| 5,276,399 | 1/1994 | Kasten et al. | 324/319 |
| 5,296,810 | 3/1994 | Morich | 324/318 |
| 5,329,266 | 7/1994 | Soelnder et al. | 335/216 |
| 5,517,169 | 5/1996 | Laskaris et al. | 335/301 |

OTHER PUBLICATIONS

Iwasa, Yukikazu, "Case Studies In Superconducting Magnets", Plenum Press (1994), ISBN 0–306–44881–5, Fig. 1.1 on p. 3.

Wilson, M.N. "Superconducting Magnets", Clarendon Press, Oxford (1983), Chapter 9, pp. 218–232.

Primary Examiner—Renee S. Luebke
Assistant Examiner—Tuyen T. Nguyen
Attorney, Agent, or Firm—Fenster & Company Patent Attorneys, Ltd.

[57] ABSTRACT

This invention is concerned with actively shielded magnetic resonance (MR) devices and more particularly with an improved system which includes only a single former. All the coils of the system those with backward current and those with forward current, can all be wound in a single process on a single former machined during a single installation.

28 Claims, 7 Drawing Sheets

SINGLE FORMER ACTIVE SHIELD MAGNETS

FIELD OF INVENTION

This invention is concerned with magnetic resonance (MR) diagnostic imaging devices and, more particularly, with an improved MRI magnet with active shielding which uses a single former.

BACKGROUND OF THE INVENTION

MRI magnets, used for diagnostic imaging, usually use superconducting coils to generate the high intensity static magnetic field needed in such systems and some type of a shield to prevent stray field from contaminating spaces where general public has access.

There are two basic methods for shielding the MRI magnet: ferromagnetic shielding and active shielding. The first method involves placing iron around the MRI magnet in form of a return Yoke.

The second method involves using active shielding magnets. The methods for active shielding magnets use counter-running coils with currents in opposite directions and iron in various combinations.

In active shielding for MRI systems two sets of coils are used: a first set of coils, responsible for the main homogenous magnetic field, and a second coil system, which is used to provide the active shielding. Usually the coils are made of superconductive material.

When constructing an active shield magnet prior art has required that the outer and inner magnets are wound on separate formers and the formers themselves are later assembled together. This was because coils overlapped along the Z axis.

In order to assemble the shielding coils, which may be subject to significantly large forces, it is necessary to have massive components to accommodate the fixings. It is an unfortunate consequence of this technique that the accumulation of the smallest tolerances and relative movements of parts of the assembly under load leads to important degradation of homogeneity.

Technically each set of coils was fitted in slots on its own special coil support which is called a former, i.e. the first set of coils 22 responsible for the main homogenous magnetic field is fitted on a first former 23, and the second set of coils 21 responsible for the active shielding is fitted on a second former 24 (FIG. 1). This structure which uses at least two separate formers for an MRI system was disclosed in prior art see for example U.S. Pat. Nos.: 5,329,266, 5,210,512, 5,296,810, 4,890,082, 5,045,826. In particular, Elscint's U.S. Pat. No. 5,012,217 on an integrated active shielded magnet is further improved by this disclosure.

Active shield magnets for use in MRI can be constructed in two principal ways. Either the wire is wound directly onto a former or the wire is wound into a mould and impregnated with resin. The second method produces separate free-standing coils which can be assembled onto a former or formers at a later time. Both methods have been used to construct working magnets.

Winding the wire directly onto a former is today the preferred method by the MRI manufacturer. When winding the wire directly onto the former the process time is shortened, thus saving valuable time. Furthermore the direct winding is more accurate in placing the coils exactly at the right position on the former compared with the moulding-assembly route.

Active shield systems with more than one former, as disclosed in prior art, have many disadvantages. For example it is difficult to assemble the two formers, thus the accuracy of the system is decreased. Another disadvantage of such a system is its size which is usually large. Yet another disadvantage of the two-former system is the fact that its coils can not be wound on the former itself in a single process. [This means that the winding process becomes more expensive,, slower, and less accurate].

One solution offered by prior art to try and solve the difficulty in assembling the two formers was using some type of a single former. For example see U.S. Pat. No. 5,136,273. In this cited art a single former is used and the shielding coils are placed at the ends of the former at a larger radius than the inner main coils. Such a solution as described in the above cited art solves the assembly problem but does not enable winding the coils in a single process nor does it give the most compact solution for a given homogeneity.

Because the coils cannot all be wound directly onto the single former, the possibility of achieving improved accuracy is lost.

Thus, a compact MRI magnet with a single former which allows a single winding process is most desired. Such a system offers great advantages in the construction of the magnet by making the coil winding process faster, cheaper, and easier to control.

It is the intention of the present invention to introduce an improved active shielding MRI system which is more compact, and uses a single former which can be wound in a single process.

BRIEF DESCRIPTION OF THE INVENTION

According to the present invention, an improved actively shielded magnetic resonance imaging magnet is introduced.

The improved magnet provides a more compact, less expensive, and more accurate MRI system, which enables winding all the magnet's coils in a single process on a single former.

said system comprising:

an active shielding magnet, said active shielding magnet including:

a first set of magnet coils with forward going current and a second set of magnet coils with backward going current;

each coil from said first and second sets of magnet coils has its own typical dimensions, which extend from its inner axial radius to its outer axial radius;

said first and second sets of magnet coils all arranged along a single former, said single former includes flanges, which enable winding of all coils directly onto said single former in a single process.

BRIEF DESCRIPTION OF THE DRAWINGS

The above described and other objects and features of the present invention will be best understood when considered in the light of the following description made in conjunction with the accompanying drawings; wherein.

GENERAL DESCRIPTION

Figure 3:
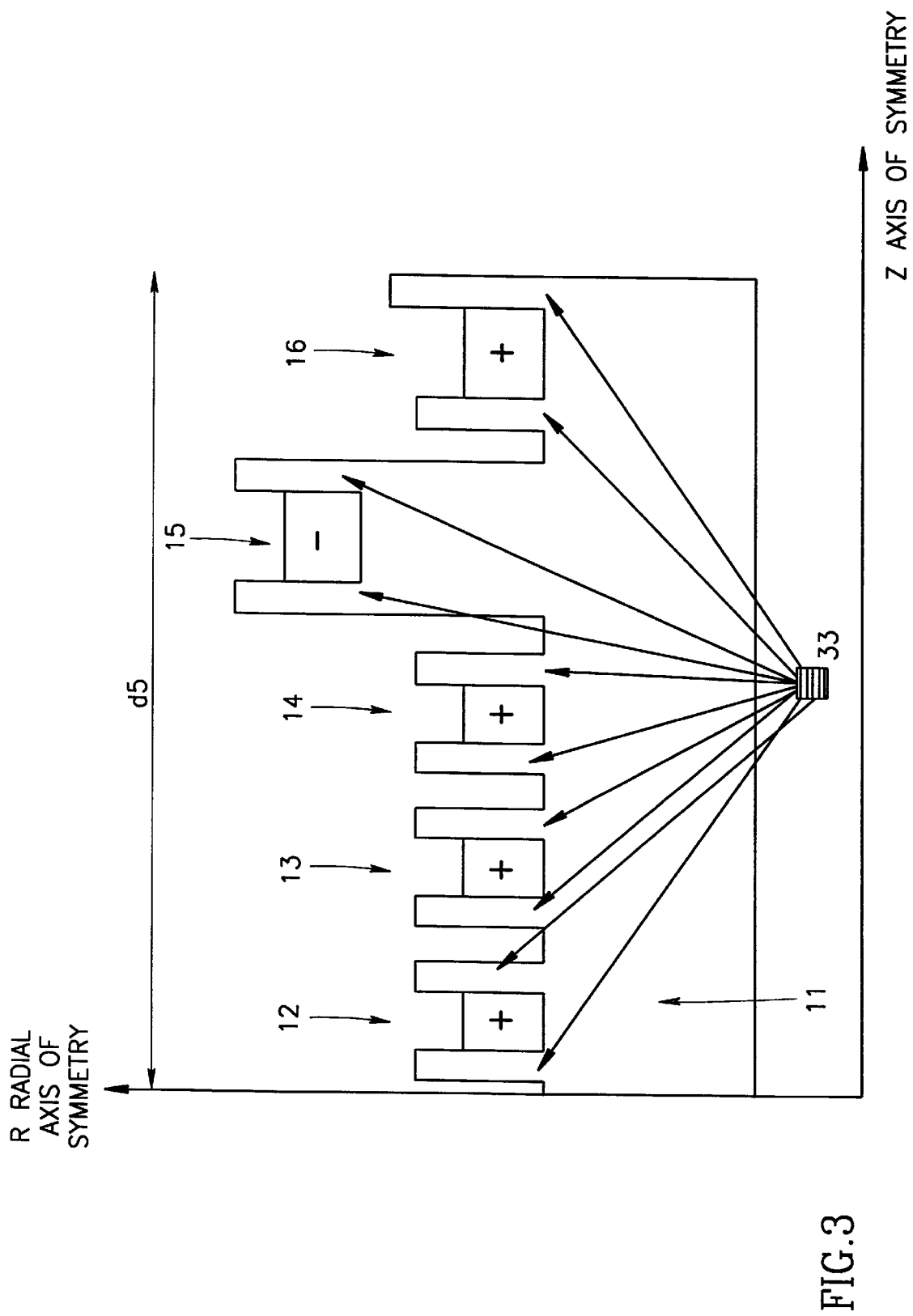
FIG. 3—an example of using a single former in an MRI magnet as used in present invention.

FIG. 3 shows the coil arrangement in an actively shielded MRI magnet with a single former according to Applicants' invention. It should be understood that only one quadrant is shown, the other three as defined by the Z and R axis are implied by symmetry. The Z axis coincides with the bore of an MRI magnet, and the R axis coincides with the central radial plane of symmetry of an MRI magnet.

A first set of coils: 12, 13, 14, 16, usually from a superconducting material, is placed around the Z axis on given inner radii as indicated in FIG. 3. This set of coils, which carries a forward current as indicated by a + sign in the figures, is also referred to as the main set of coils (the main coils create the main magnetic field of the MRI).

A second set of coils, which includes in this example only coil 15, usually from a superconducting material, is placed around the Z axis usually on an outer radius (a larger radius than the main coil system and coaxial with it), as indicated in FIG. 3. A current opposite in direction to the current supplied to the main coils, as indicated by a − sign in the figures, is supplied to the second set of coils. The second set of coils carries a backward current. Both coil systems are connected in series to a power supply (not seen in the drawing) for energizing and de-energizing. The coil systems in series can be put into persistent mode by means of a superconducting switch as is well known in prior art.

In FIG. 3 each of the coils, those with forward going current: 12, 13, 14, 16 and those with backward going current 15, are arranged along a single former 11 between flanges 33. Flanges 33 are the side walls of the winding groove. They ensure that all layers of a coil are wound with the same starting and finishing axial dimensions. Without flanges the axial dimensions of coils formed by winding are undefined. A simple example would be a cotton reel. Without the side flanges the cotton would soon fall off the reel into a tangled mass.

Figure 5:
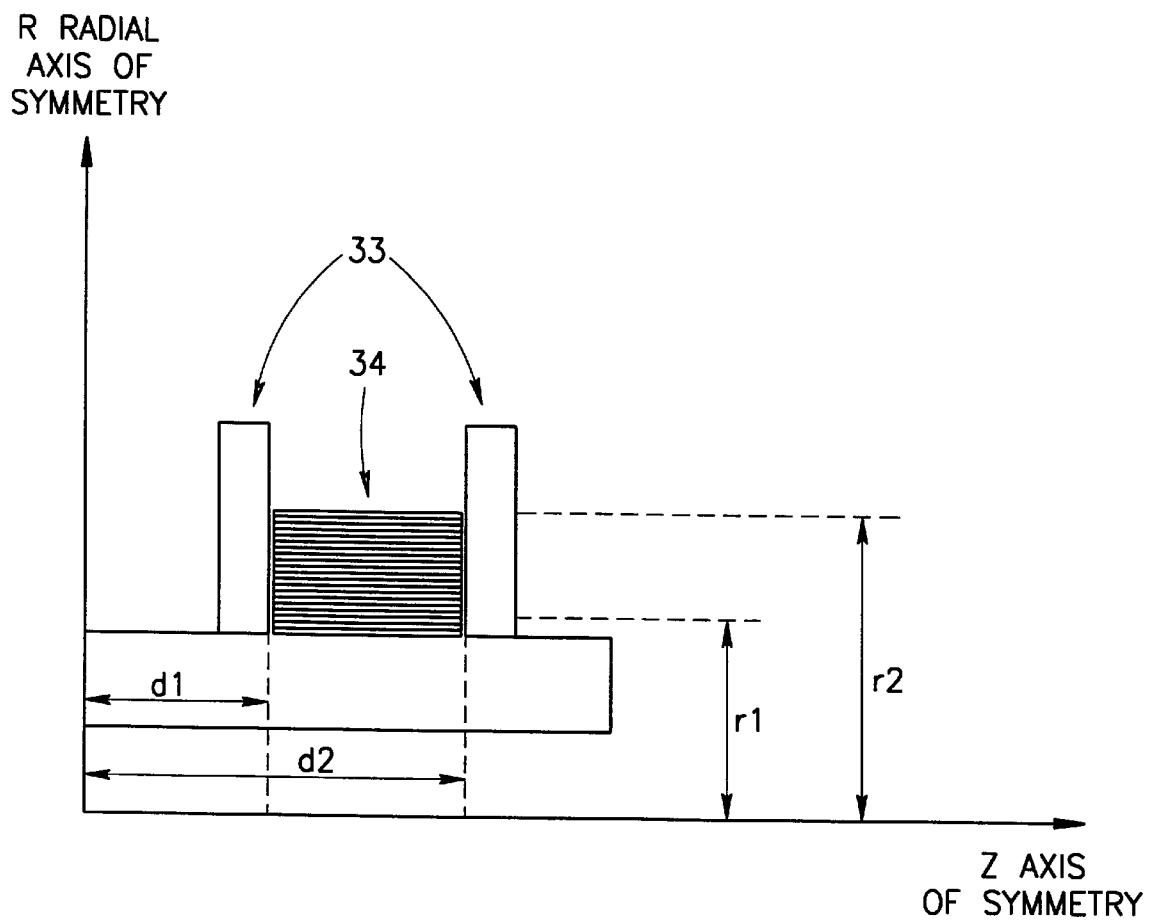
FIG. 5—dimensions of a single coil on a former in an MRI system.

FIG. 5 illustrates the dimensions of a single coil wound on a former. Each coil 34 from either first or second sets of coils is placed between flanges 33 and its individual size is defined as the distance between the flanges, i.e. the distance from the axial dimension d1 of a specific coil to its axial dimension d2.

The radial dimensions of the coil are r1, the inner radial dimension, and r2, the outer radial dimension.

All of the coils (12–16) can take any position along the single former 11 as long as they comply with the following limitations and constraints.

The first constraint is that the first and second coil sets are arranged in a three dimensional space so that a strong and homogenous magnetic field is generated inside the magnet and a the stray field close to zero is measured outside the magnet.

A second constraint on the system is that all coils are placed on the single former 11 between flanges 33 in such a way that they do not overlap in the Z direction. This means that the larger axial dimension of a specific coil is smaller than the smaller axial dimension of the next coil. In the example of FIG. 3, the larger axial dimension of coil 14 is smaller than the smaller axial dimension of coil 15. The same constraint applies to all the coils.

This constraint enables placing all coils, from both first and second coil sets on a single former.

Since all coils (both said first and second sets of coils) are wound on a single former, there are no accuracy problems which are a result of having to assemble more than one former. Furthermore, since all of the coils are placed in the grooves formed by flanges on a single former, the system can be wound in a single process: thus providing a process which is less expensive, faster, and easily controlled.

The single former can be made more accurately since it is machineable without disturbance on a single machining step.

Figure 2:
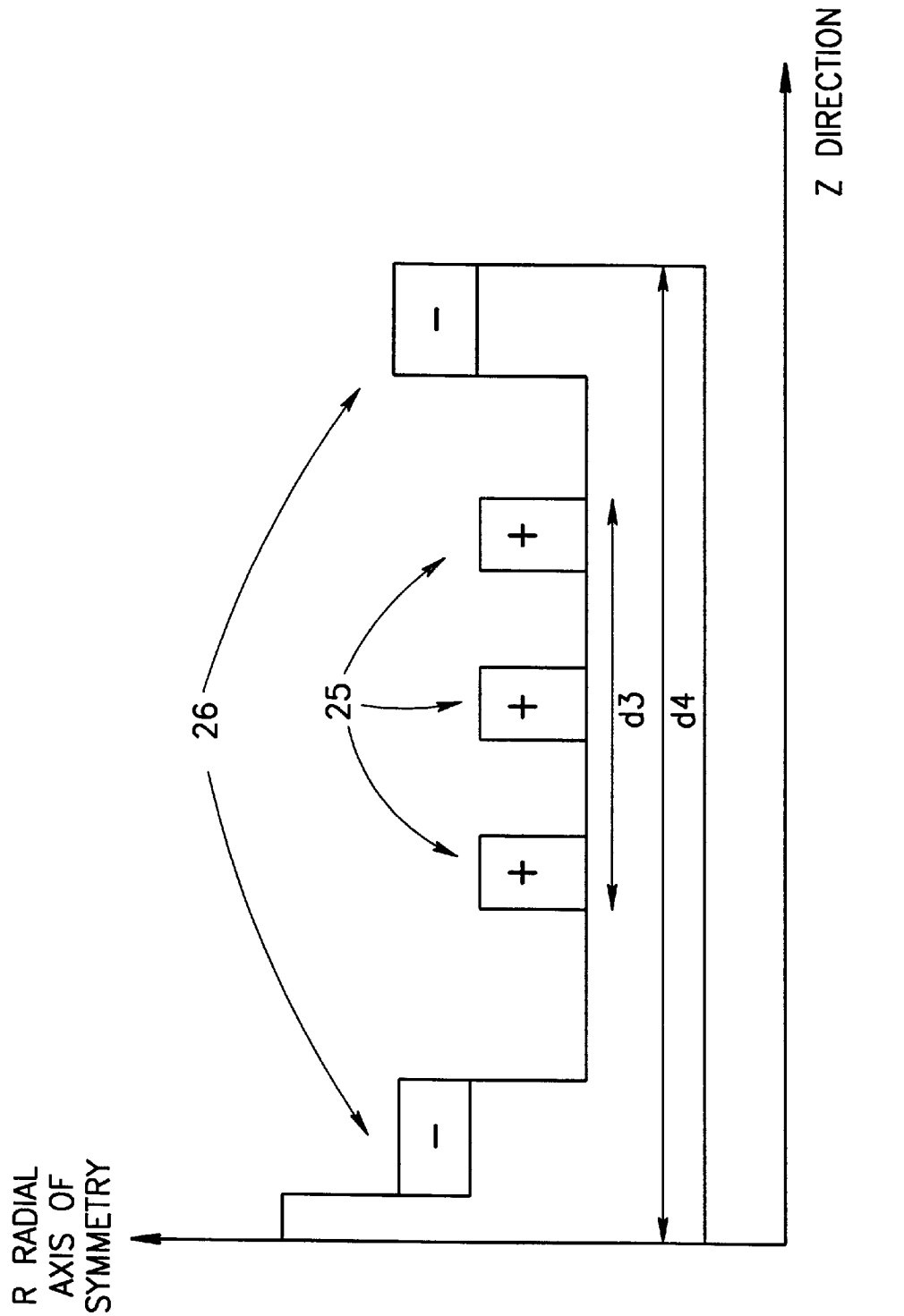
FIG. 2 prior art—an example of the coil arrangement in an MRI magnet with active shielding, which places the active shielding coils at the ends of a single former.

Another unique feature of the present invention is that it offers the advantage of the most compact system in the axial direction or a given magnetic field homogeneity. This is due to the special placement of the shielding coils which do not need not be the most axially displaced on the former, as opposed to previous systems, see for example U.S. Pat. Nos.: 5,045,826, 5,136,273 and 4,968,961. These cited art suggest placing the shielding coils 26 at the two ends of the former (FIG. 2), i.e., the main coils 25 are always in the middle of the former in between the shielding coils 26 (FIG. 2).

It is well known in the MRI industry that the homogeneity of the imaging volume is controlled principally by the axial extent of the inner magnet. Thus, for a given homogeneity both the present invention and the cited art, would have to include the same axial extent for the inner magnet. In other words, for a given homogeneity the axial extent of the inner magnet (the first set of coils) of the cited art d3 of FIG. 2 would have to be equal to the axial extent of the inner magnet (the first set of coils), 2×d5 of FIG. 3. But while in Applicants' invention the axial extent of the inner magnet is also the total extent of the system, the axial extent of the prior art system is d4 which is longer than d3 (FIG. 2). This guarantees that Applicants' invention which has shown shielding coils as not being the most axially displaced of the coil set, will have a more compact design for a given homogeneity.

A MRI system which is more compact provides many advantages. Hospital space which is very expensive is saved by using a more compact system. In addition, studies on the patient's attitude and feeling to the MRI system which he lies in, indicate that a shorter system gives patients a more comfortable feeling. This of course again is a very positive result. Thus, it can be concluded, that a shorter MRI system which gives the same imaging qualities as a longer one, is most desirable.

Figure 4A:
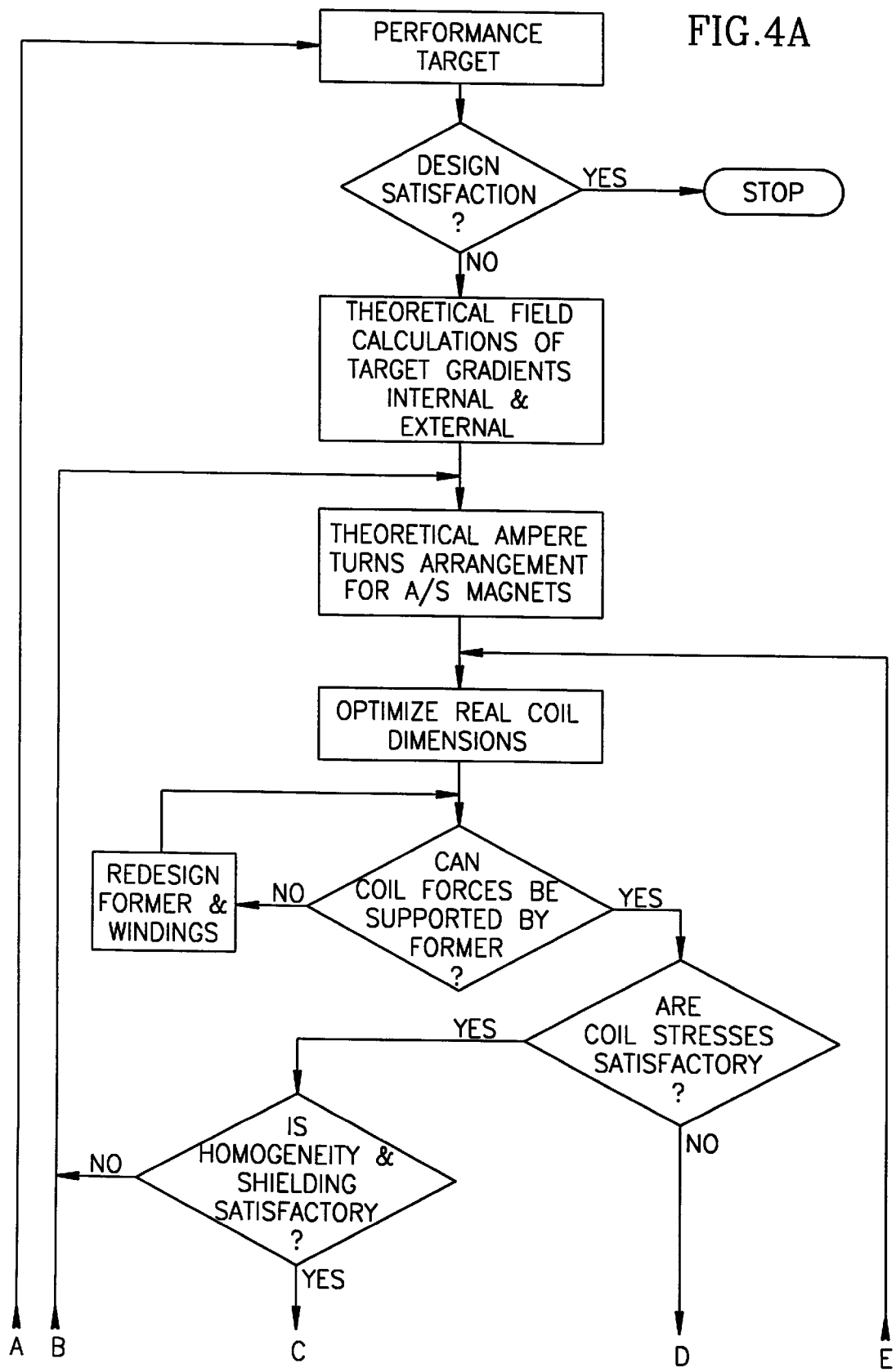
FIG. 4—a flow chart of an algorithm for designing the coil system in the present invention.
Figure 4B:
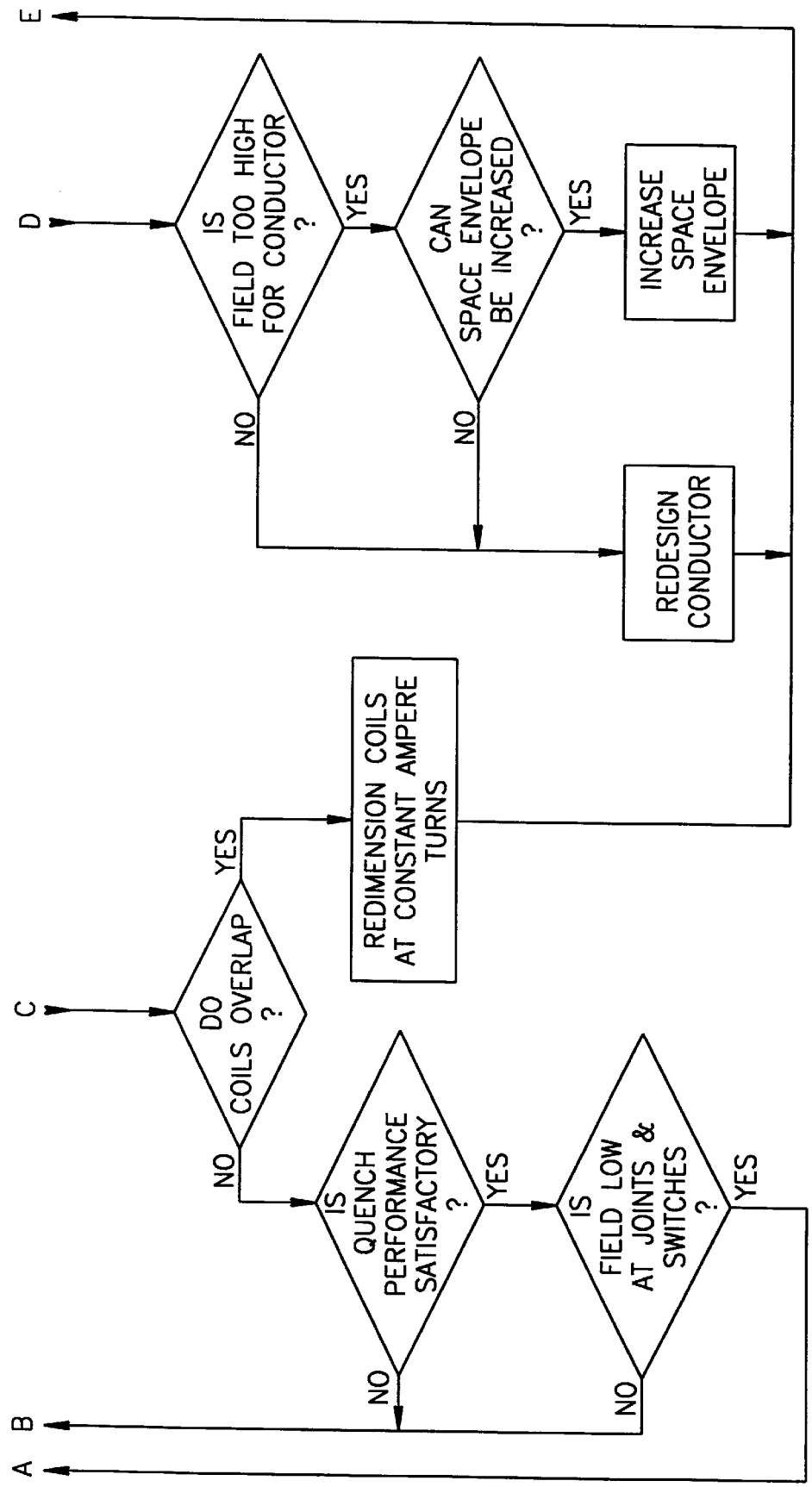

An algorithm for designing an optimal active shield magnet with a single former, as described in Applicants' invention, is summarized in FIG. 4 in the form of a flow chart. By operation of this algorithm in an iterative manner, different parameters of the coil system such as coil dimension, number of coil turns, and coil diameter are successively changed until the design is satisfactory i.e., the theoretical design meets or exceeds all the performance targets.

In order to check if the different performance targets are reached it is necessary to theoretically calculate the field of the target gradients internal and external, as well as the theoretical ampere turns at each iteration.

The magnetic field Bz, is usually calculated through spherical harmonics using the Legendre polynomial expansion of the magnetic field. The field at the magnet isocenter is Bo.

$$B_z(R, \theta, \Phi,) = B_0 \sum_{n=1}^{\infty} \sum_{m=0}^{n} \left(\frac{R}{R_0}\right)^n P_{nm}(\cos\theta) \times (A_{nm}\cos(m\Phi) + B_{nm}\sin(m\Phi)) \quad (1)$$

Where the spherical coordinate system is defined as radius R and angles

θ, Φ, m, and n are integers,

P, A, B, are coefficients which determine the magnitude of the magnetic field gradients.

An example of a target gradient could be that the Z 1, 2, 3, 4, 5, 6, 7 and 8, internal gradients are all as close to zero as possible, and that the external dipole field and sextupole fields (the first two terms) are also set as close to zero as possible. These axially symmetrical gradients are defined by the above expansion when m=0.

Calculating the "Theoretical ampere turns" means calculating any ampere turns which are not related to physical superconductors. Thus one can for convenience sake design a magnet with unphysical dimensions in some or all of the coils and later convert to physical dimensions. An example might be to design a magnet with all the ampere turns for each coil concentrated at a single point. This has the advantage from the aspect of mathematical simplicity. At a later time the simplistic design can be expanded in to a real working design with practical conductors.

In order to optimize real coil dimensions the axial and radial dimensions of the coils are adjusted to give the best homogeneity within the restriction of integral turns and layers within every coil as well as to satisfy all other performance targets.

The optimization takes place using a proprietary optimizer such as ZXSSQ which adjusts coil dimension as a set in such a manner as to minimize a target function. The target function might for example be generated from target gradients as mentioned above.

Performance targets are used in order to design the coils for the MRI magnet. Examples of possible performance targets are: homogeneity of the magnetic field, the magnetic forces between the coils (can the former support the forces generated by the coils), quench performance, field strength at joints, switches, and conductors, and coil stresses.

One of the performance targets is optimizing homogeneity and shielding. These targets are satisfactory when they meet or exceed the desired performance target.

The performance target for homogeneity might for example be that the magnetic field shall not vary more than +/−5 parts per million between several values measured on a defined spherical volume 50 cm. diameter, based on the isocenter of the magnet.

Another limitation to the coil arrangement is that the field in the conductors must not exceed certain limits or else the superconductivity will be lost.

Figure 1:
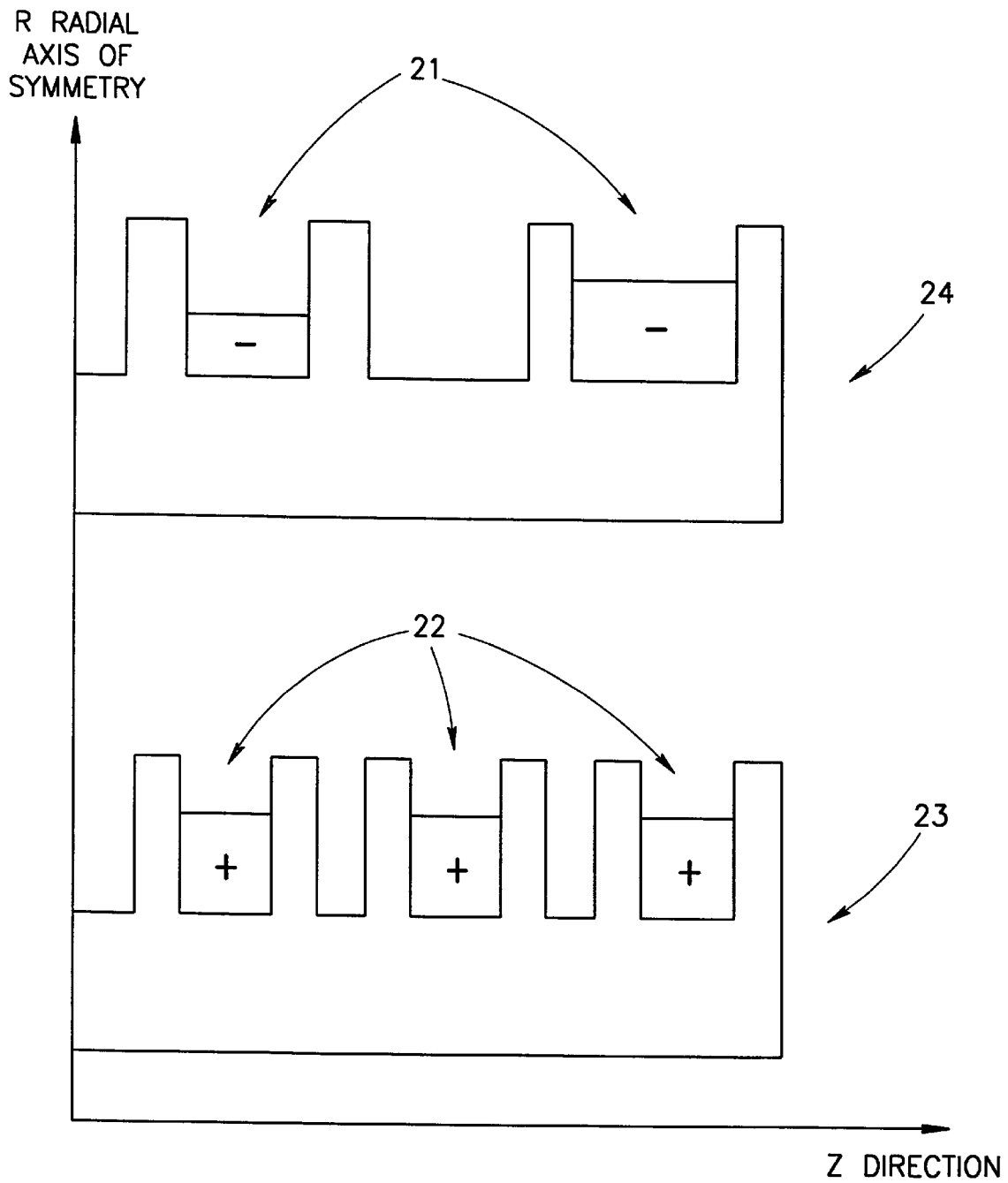
FIG. 1 prior art—an example of the coil arrangement in an MRI system with active shielding, which uses two or more formers.

An example of a field that is too high is one that lies outside the superconducting phase region. See for example "Case studies in Superconducting Magnets" by Yukikazu Iwasa, published by Plenum press FIG. 1.1 on page 3.

If the field is too high, then one option might be to increase the space envelope of the coils which lowers the field. Nevertheless, this is not possible in the case where the desired limits to the space envelope would be exceeded.

Yet another limitation which must be considered in the design is that the field at joints and switches must be low for their satisfactory performance. The actual value depends on the type of superconductor being used.

If the field is too high at the joint or switch this will cause the magnet to decay at a rate greater than the performance target.

Another constraint to consider in the designing process is the magnet's performance during a quench.

An example of satisfactory quench performance would be that the coil voltage in the event of a quench was limited to less than 1 kilo volt. When compared with earth, and the temperature of all coils in any event was less than 300 Kelvin. Quench performance is checked using the computer program "QUENCII". See, for example, the description of that computer program as described in the book entitled "Superconducting Magnets" by M. N. Wilson, published by Clarendon Press, Oxford 1983, pp. 218 et seq.

The coil forces are calculated from the vector product of current density and field:

$$\vec{F} = \vec{J} \times \vec{B} \quad (2)$$

Where

F is the force on a conductor,

J is current density, and B is magnetic field at the conductor.

V=volume of the coil.

The total force on the conductor is evaluated as the integral over the coil volume.

Stresses in the former and coil stresses are calculated using a proprietary finite element program such as ANSYS.

An example of satisfactory coil stress would be that the peak Von Mises stress should not in the working conditions exceed the 0.1% proof stress of the superconductor, 200 Newtons per square millimeter.

Figure 6:
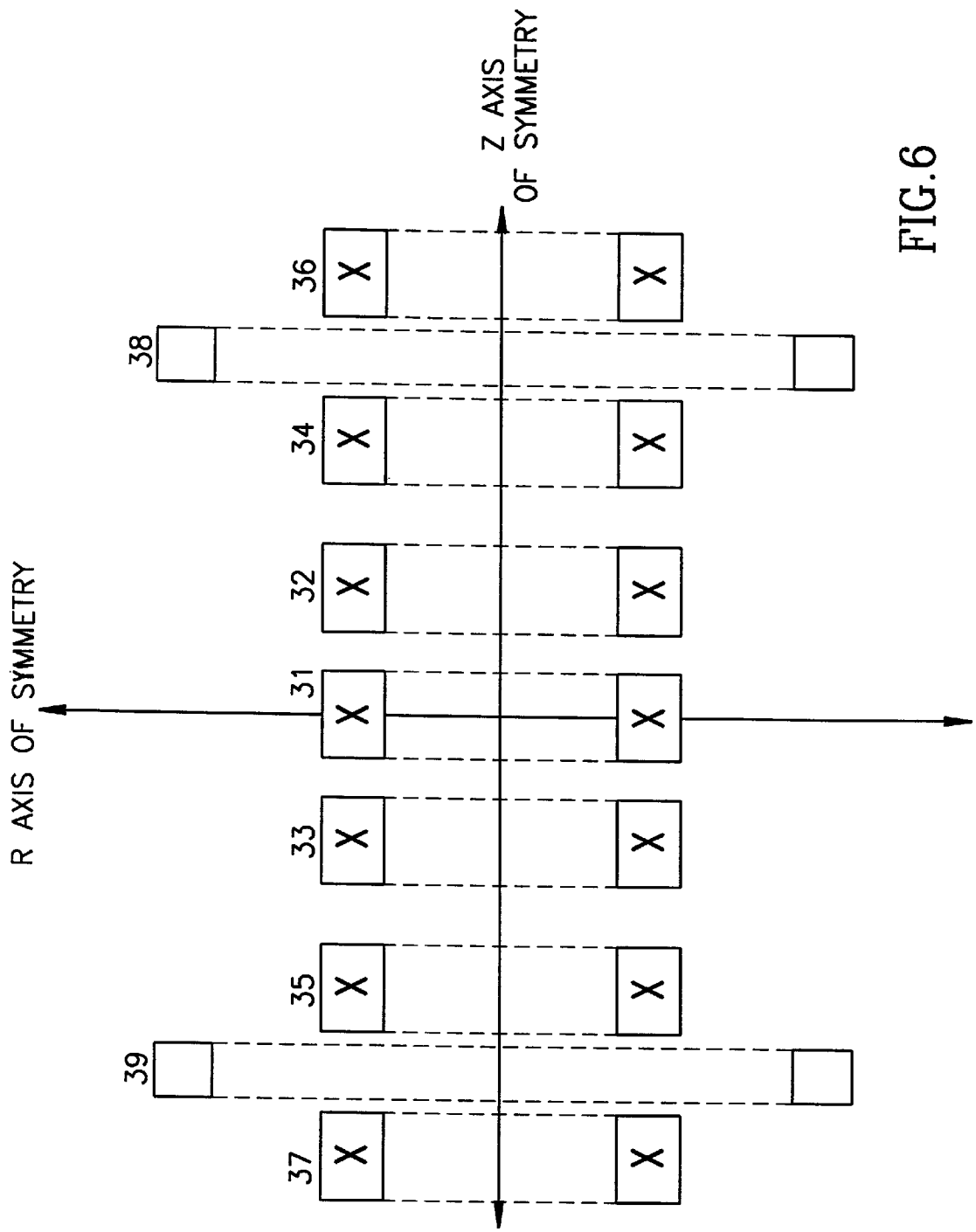
FIG. 6—an example of the coil arrangement in a working embodiment of the present invention, an MRI magnet which uses a single former.

FIG. 6 shows an example of a working coil configuration designed by the algorithm of FIG. 4 according to Applicant's invention of an active shield MRI system with a single former. The dimensions given implied by symmetry about the plane Z=0 a set of 9 coils (31–39) as illustrated in FIG. 6. The coils shown are solenoids, and so they also have symmetry about the Z axis. On the inner (forward going) magnet there are 7 coils (31–37) and so by symmetry the center coil spans the plane Z=0. This is indicated in the table below as a coil starting at Z=0 and the other half is implied. Of course, physically, one winds only one coil at this position and does not make any joints on the Z=0 plane.

Coils 38 and 39 represent the second set of coils which carries the backward current. These are the shielding coils.

The following table defines the coils dimensions and characteristics in a possible active shield magnet as illustrated in FIG. 6. The dimensions are defined according to FIG. 5. This configuration can be wound on a single former in a single process, while complying with all constraints and limitations of the present invention.

Coil Characteristics for the Configuration of FIG. 6

| Coil Num | Inner radial dim r1 [cm] | Outer radial dim r2 [cm] | Inner axial dim [cm] d1 | Outer axial dim [cm] d2 | Turns per coil | Conductor diameter [mm] |
| --- | --- | --- | --- | --- | --- | --- |
| Coil 31 | 44.32 | 46.944 | 0 | 3.677 | 802 | 1.1 |
| Coil 32, 33 | 43.948 | 47.376 | 10.54 | 16.945 | 1826 | 1.1 |
| Coil 34, 35 | 43.136 | 47.977 | 26.758 | 34.112 | 2960 | 1.1 |
| Coil 36, 37 | 39.5 | 49.424 | 53.416 | 61.00 | 6258 | 1.1 |
| Coil 38, 39 | 68.080 | 72.733 | 39.00 | 51.00 | 4642 | 1.1 |

The variations in inner radial dimension provide additional degrees of freedom in the design in order that a more homogeneous imaging volume can be created.

To summarize an improved MRI system with a single former is introduced. The new and unique system has many advantages over prior art system's which use more than one former, as well as having significant advantages over prior art which use a single former with its shielding coils placed most axially.

An active shield magnet constructed on the above principle would offer considerable saving in weight size and cost compared with previous designs suggested for MRI systems, as well as providing a more accurate system.

While the invention has been described with reference to a preferred embodiment, it should be understood that this embodiment is exemplary only and is not meant to act as a limitation on the scope of the invention.

What is claimed is:

1. An improved actively shielded magnetic resonance imaging system, which provides a more compact, less expensive, and more accurate MRI system, which enables winding all said system's coils in a single process;

said system comprising:

an active shielding magnet, said active shielding magnet including:

a first set of magnet coils with forward going current, a second set of magnet coils with backward going current, each coil from said first and second sets of magnet coils has its own typical dimensions which extend radially from its inner radius to its outer radius and axially from an inner axial plane to an outer axial plane;

said first and second sets of magnet coils all arranged along a single former; and said single former including flanges, separating the coils so that the outer axial plane of any of the coils extends at most only up to the inner axial plane of the adjacent coil which enables winding all of said coils directly onto said single former in a single process without overlap.

2. The system of claim 1 wherein all coils are arranged in any position along said single former, providing they comply with the following constraint:

said first and second sets of magnet coils are all arranged in a three dimensional space so that a strong and homogenous magnetic field is generated inside the magnet and a stray field close to zero is generated on the outside of the magnet.

3. The system of claim 2 wherein all coils from both said first and second sets of magnet coils are arranged in any position along said single former, providing that a coil's larger axial position ends before said smaller axial position of the coil next to it begins, said arrangement resulting in a single former with no overlapping said first and second sets of magnet coils in the Z axis.

4. The system of claim 3 wherein said second set of coils is placed at a larger radius than said first set of coils.

5. The system of claim 4 wherein said first and second coils are arranged in any position along said single former, providing the coil forces can be supported by the former.

6. The system of claim 5 wherein real coil dimensions are optimized.

7. The system of claim 6 wherein said first and second coils are arranged in any position along said single former, providing homogeneity and shielding are satisfactory in said system.

8. The system of claim 7 wherein said first and second coils are arranged in any position along said single former, providing the coil stresses are satisfactory.

9. The system of claim 8 wherein said first and second coils are arranged in any position along said single former, providing the field is not too high for the system's conductors.

10. The system of claim 1 wherein said first and second coils are arranged in any position along said single former, providing quench performance is satisfactory.

11. The system of claim 10 wherein said first and second coils are arranged in any position along said single former, providing the field is low enough at the system's joints and switches.

12. The system of claim 11 wherein said first and second coils are superconducting coils.

13. The system of claim 10 wherein said first and second coils are normal conducting coils.

14. The system of claim 11 wherein said first and second coils are solenoid type of coils.

15. A method for designing an improved actively shielded magnetic resonance imaging system, which provides a more compact, less expensive, and more accurate MRI system whose magnet coils can be wound in a single process;

said method including:

using an active shielding magnet;

including in said active shielding magnet:

a first set of magnet coils with forward going current, a second set of magnet coils with backward going current, winding each coil of said first and second sets of magnet coils with its own typical dimensions which extend radially from its inner radius to its outer radius and axially from an inner axial plane to an outer axial plane;

arranging said first and second sets of coil along a single former;

using flanges on said single former; and winding all of the coils directly onto said single former in a single process so that the outer axial plane of any of the coils extends at most to the inner axial plane of an adjacent coil.

16. The method of claim 15 wherein said method includes the step of arranging all coils, both said first and second sets of magnet coils, in any position along said single former, providing said first and second sets of magnet coils are all arranged in a three dimensional space so that a strong and homogenous magnetic field is generated inside the magnet and a stray field close to zero is generated on the outside of the magnet.

17. The method of claim 16 wherein said method includes the step of arranging all coils in any position along said single former, providing said arrangement makes sure that a coil's larger axial dimension ends before said smaller axial dimension of the coil next to it begins, said arrangement resulting in a single former with no overlapping of said first and second sets of magnet coils in the Z axis.

18. The method of claim 17 wherein said method includes the step of positioning said second set of coils at a larger radius than said first set of coils.

19. The method of claim 18 wherein said method includes the step of arranging said first and second set of coils, in any position along said single former, providing the coil forces can be supported by the former.

20. The method of claim 19 wherein said method includes optimizing the real coil dimensions.

21. The method of claim 20 wherein said method includes the step of arranging said first and second set of coils, in any position along said single former, providing homogeneity and shielding are satisfactory.

22. The method of claim 21 wherein said method includes the step of arranging said first and second set of coils, in any position along said former, providing coil stresses are satisfactory.

23. The method of claim 22 wherein said method includes the step of arranging said first and second set of coils, in any position along said single former, providing the system's magnetic field is not too high for the system's conductors.

24. The method of claim 23 wherein said method includes the step of arranging said first and second set of coils, in any position along said single former, providing quench performance is satisfactory.

25. The method of claim 24 wherein said method includes the step of arranging said first and second set of coils, in any position along said single former, providing the systems magnetic field is low enough at the system's joints and switches.

26. The method of claim 25 wherein said method includes using superconducting coils for said first and second coils.

27. The method of claim 25 wherein said method includes using solenoid type coils for said first and second coils.

28. The method of claim 25 wherein said method includes:

calculating theoretical ampere-turns arrangements for both the magnet coils generating a homogeneous field and for the magnet coils generating the active shielding field, calculating theoretical gradient fields, optimizing real coil dimensions based on said calculations, designing the coil former to support the coil forces, determining if the coil stresses due to the coil forces are within the strength limits of the former and of the conductors used, if not, determining if the field is too high for the conductors, if it is not, then redesigning the conductor, if it is, determining whether the envelope space for the windings can be increased, if the envelope space can be increased, increasing the envelope space, if not redesigning the conductors, where the coil stresses are satisfactory determining if the shielding and homogeneity of the field are satisfactory, if not then redetermining the theoretical ampere-turns, if homogeneity and shielding are satisfactory then assuring that there is no coil overlap by redimensioning the coils at the constant ampere-turns if necessary, and once again optimizing real coil dimensions, determining if there is satisfactory quench performance, if not, then again determining the theoretical ampere-turns arrangements for the magnets, if the quench performance is satisfactory, then determining if the performance targets have been met and if not again determining the ampere-turn arrangements for the magnets, if the performance targets have been met then the design is satisfactory.

* * * * *

UNITED STATES PATENT AND TRADEMARK OFFICE
CERTIFICATE OF CORRECTION

PATENT NO. : 5,900,794
DATED : May 4, 1999
INVENTOR(S): Alex PALKOVICH, John Maurice BIRD, Alan George Andrew ARMSTRONG It is certified that error appears in the above-identified patent and that said Letters Patent is hereby corrected as shown below:

Col 4 line 23 change "or" to --for--

Col 6 line 18 change " volt. When" to --volt when--

Col 6 line 21 change "QUENCII" to --QUENCH--

Col 6 line 29 change " $\overline{F} = \overline{J} \times \overline{B}$ " to -- $\overline{F} = \int \overline{J} \times \overline{B}$ --

Col 8 line 15 after "overlapping" insert --of--

Signed and Sealed this

Ninth Day of November, 1999

Attest:

Q. TODD DICKINSON

Attesting Officer   Acting Commissioner of Patents and Trademarks